United States Patent

Murata et al.

[11] Patent Number: 5,431,600
[45] Date of Patent: Jul. 11, 1995

[54] AUTOMATIC TRANSFERRING SYSTEM USING PORTABLE CLOSED CONTAINER

[75] Inventors: Masanao Murata; Tsuyoshi Tanaka; Teruya Morita; Hitoshi Kawano, all of Ise, Japan

[73] Assignee: Shinko Electric Co., Ltd., Tokyo, Japan

[21] Appl. No.: 132,333

[22] Filed: Oct. 6, 1993

[30] Foreign Application Priority Data

Oct. 6, 1992 [JP] Japan .................................. 4-267670

[51] Int. Cl.⁶ .............................................. B65B 5/02
[52] U.S. Cl. ...................................... 454/187; 414/225
[58] Field of Search ................ 434/187; 414/222, 225, 414/226

[56] References Cited

U.S. PATENT DOCUMENTS

| | | | |
|---|---|---|---|
| 4,851,018 | 7/1989 | Lazzari et al. | 55/356 |
| 4,923,352 | 5/1990 | Tamura et al. | 414/225 |
| 4,963,069 | 10/1990 | Wurst et al. | 454/187 X |
| 5,134,459 | 8/1992 | Takahashi et al. | 454/187 |
| 5,145,303 | 9/1992 | Clarke | 454/187 X |

FOREIGN PATENT DOCUMENTS

| | | | |
|---|---|---|---|
| 4209297 | 9/1993 | Germany | 454/187 |
| 106888 | 4/1993 | Japan | 454/187 |
| 223300 | 8/1993 | Japan | 454/187 |

Primary Examiner—Harold Joyce
Attorney, Agent, or Firm—Bacon & Thomas

[57] ABSTRACT

In an automatic transferring system using a portable closed container in which articles to be conveyed between a first equipment and a second equipment are set in the portable closed container, which is automatically conveyed by an unmanned conveying vehicle; the automated guided vehicle has a container interface in its carriage which is adapted to control the operation of automatically taking the articles in and out of the closed container.

12 Claims, 8 Drawing Sheets

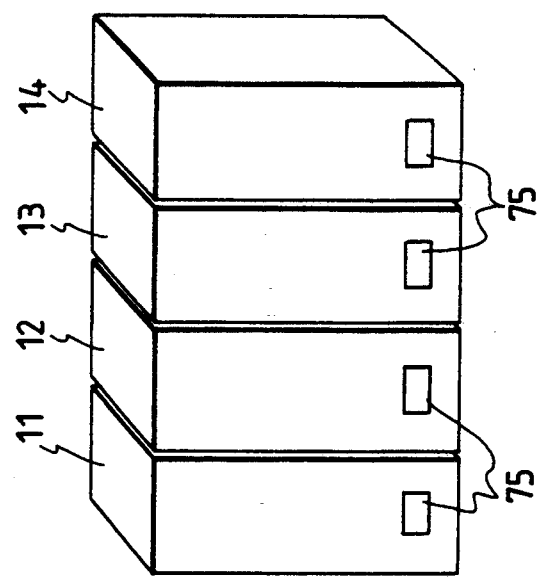
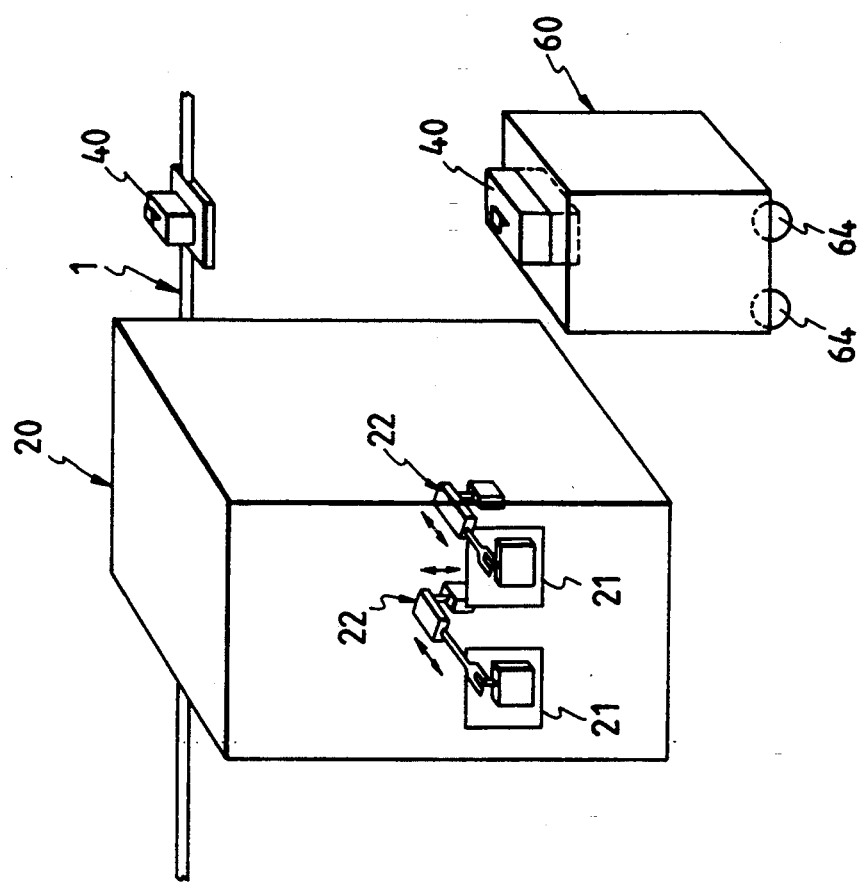
FIG. 1

AUTOMATIC TRANSFERRING SYSTEM USING PORTABLE CLOSED CONTAINER

BACKGROUND OF THE INVENTION

1. Field of the invention

This invention relates to an automatic transferring system for a portable closed container, in which articles to be transferred from equipment to equipment are set in the portable closed container, which is moved by an automated guided vehicle (hereinafter referred to "AGV", when applicable) having a container interface

2. Related Art

For instance, semiconductor equipments are manufactured in a clean room, the atmosphere in which has been purified. When semiconductor wafers are transferred between processing equipments or during inter-bay transferring in such a clean room, in order to prevent the sticking of particle onto the semiconductor wafers, the semiconductor wafers are put in a portable closed container 40 as shown in FIG. 9.

In FIG. 9, reference numeral 41 designates a container body; 42A, a flange defining the opening 42 of the container body 41; 43, a handle; 44, a hollow bottom lid; and 45A and 45B, sealing members. The bottom lid 44 has a locking/unlocking mechanism as shown in FIG. 10. In FIG. 10, reference numeral 45 designates a cam; 46, a plate-shaped lock arm having a rolling element 46a, the lock arm being cantilevered in such a manner that it is longitudinally movable; 47, fulcrum members; and 48, a spring. Further in FIG. 10, reference numeral 49 designates a cam shaft extended from a lifting stand 50 which forms a container interface (described later). The cam shaft 49 is spline-engaged with the cam 45. The lifting stand 50 incorporates a cam shaft drive mechanism 51 adapted to turn the cam shaft 49 through a predetermined angle. The lock arm 46 is engaged with a recess 42B, which is formed in the inner surface of the opening 42 of the container body 41. Referring back to FIG. 9, semiconductor wafers W are stored in a cassette 52.

FIG. 11 shows one example of a conventional automatic transferring system using a closed container of this type in a clean room.

In FIG. 11, reference numeral 1 designates an LIM (linear induction motor) type inter-bay transferring line; 11 through 14, wafer processing equipments such as a CVD equipment and a film forming equipment; 20, a stocker; and 30, an automated guided vehicle (hereinafter referred to "AGV", when applicable) having an article handling robot 31.

In the system, the AGV 30 receives the closed container 40, in which wafers to be processed have been set, from the stocker 20 with the aid of the robot 31, and then moves to deliver the closed container 40 to one of the wafer processing equipments 11 through 14. Furthermore, the AGV 30 receives the cassette, in which wafers processed have been stored, from the wafer processing equipment with the aid of the robot 31, and carries it over to the stocker 20. At the wafer processing equipment, the cassette is automatically taken out of the closed container 40, and then moved, for instance, to a CVD furnace (not shown), and the cassette, in which wafers processed have been stored, is automatically taken into the closed container 40. For this purpose, each of the wafer processing equipments is provided with means (the aforementioned container interface) for automatically taking a cassette in or out of a closed container.

As indicated in FIG. 11, the wafer processing equipments 11 through 14 have stands A, where the container interfaces are built, respectively. At each wafer processing equipment, the closed container 40 is placed on the stand A coaxially with an opening B formed in it (see FIG. 9).

As was described above, in the conventional system, the wafer processing equipments 11 through 14 having a CVD furnace, a diffusing furnace, etc. and washing equipments have the container interfaces, respectively. Hence, those equipments are unavoidably bulky, and high in manufacturing cost.

In a wafer processing equipment adapted to process a number of wafers for batch processing, empty closed containers must be handled suitably, and it is necessary to provide a space for it. For instance in the case of a diffusing furnace for processing 100 wafers, four empty closed containers are necessary because, in general, one cassette accommodates twenty-five wafers.

The clean room is considerably high in constructing cost and in running cost. Therefore, if the wafer processing equipments are bulky, then the resultant semiconductor wafers are greatly increased in manufacturing cost.

SUMMARY OF THE INVENTION

In view of the foregoing, an object of this invention is to provide an automatic transferring system using a portable closed container in which the wafer processing equipments are reduced in size, simplified in arrangement, and decreased in manufacturing cost, and which is relatively small in installation space, and can be provided compact at low cost.

According to an aspect of the present invention, there is provided an automatic transferring system comprising a portable closed container in which articles to be transferred between first and second equipments are set in the portable closed container; and an automated guided vehicle by which the portable closed container is automatically moved, the automated guided vehicle having a container interface equipment in a carriage thereof, the container interface equipment being connected to control an operation of the automatic handling of the articles in and out of the closed container.

In the system of the invention, the automated guided vehicle (or the automated guided vehicle equipment) has the equipment (or container interface) for automatically receiving the cassette from the closed container. Hence, it is unnecessary for various processing equipments in the clean room to have such a container interface.

BRIEF DESCRIPTION OF THE DRAWINGS

FIG. 1 is a perspective view showing the arrangement of an example of an automatic transferring system using a portable closed container, which constitutes a first embodiment of this invention;

DETAILED DESCRIPTION OF THE PREFERRED EMBODIMENTS

Preferred embodiments of this invention will be described with reference to the accompanying drawings.

Figure 4:
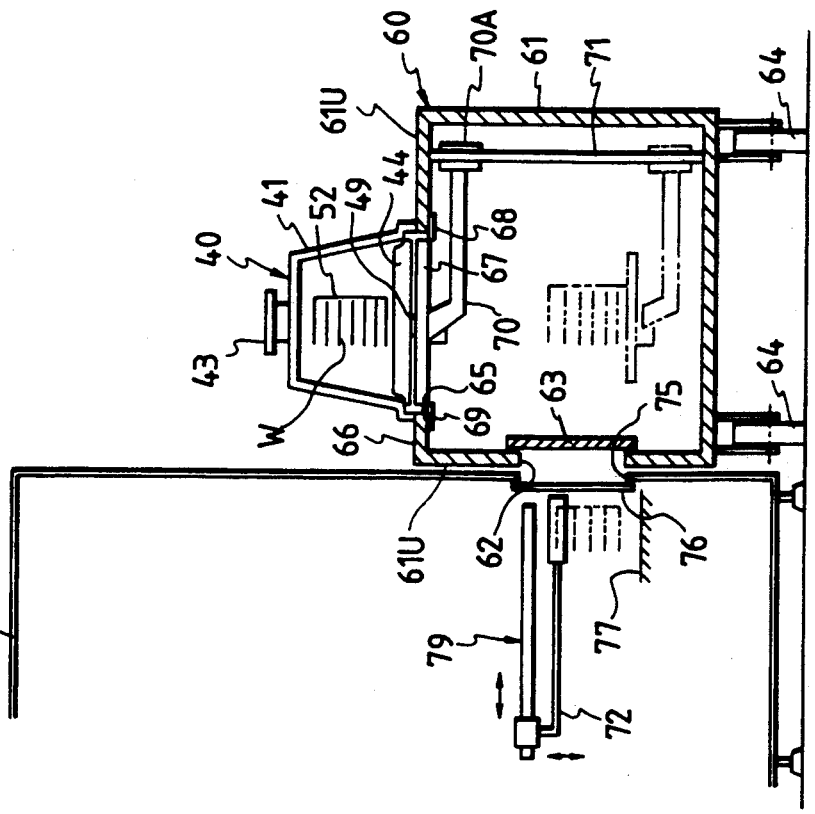
FIG. 4 is a sectional view of an example of an is automated guided vehicle (or an automated guided equipment) in the aforementioned embodiments.

A first embodiment of the invention is as shown in FIG. 1. In FIG. 1, reference numeral 60 designates an automated guided vehicle (hereinafter to as a "AGV", when applicable) or an automated guided equipment. The AGV, as shown in FIG. 4, is made up of a carriage 61, in which a container interface is built. A cassette carry-in and carry-out window 62 is formed in one side wall 61L of the carriage 61, and it is provided with an automatic door 63 for opening and closing the window 62. The carriage 61 has wheels 64. The upper wall of the carriage 61 has an opening 65, and its upper surface serves as a container placing section 66.

Further in FIG. 4, reference numeral 67 designates a lifting stand. The lifting stand 67 is large enough to go in the opening 65, and has a flange 69 which is engaged through a sealing member 68 with the lower surface of the upper wall of the carriage 61 in such a manner as to surround the opening 65. The lifting stand 67 is supported by one end portion of a supporting arm 70 which is extended laterally. The other end portion 70A of the supporting arm 70 is threadably engaged with a threaded shaft 71 held vertical, and slidably engaged with a guide shaft (not shown) which is also held vertical. The threaded shaft 71 is turned in one direction and in the opposite direction by drive means (not shown). The lifting stand 67, similarly as in the case of the above-described lifting stand 50, incorporates a cam shaft 49, and a cam shaft driving mechanism 51 for turning the cam shaft 49 through a predetermined angle.

The carriage 61 has a cassette placing member 72, which is supported by one end portion of a supporting arm 73. The other end portion 73A of the supporting arm 73 is threadably engaged with a threaded shaft 74 which is extended horizontally towards the cassette carry-in and carry-out window 62, and slidably engaged with a guide shaft (not shown) which is also extended horizontally.

A cassette carry-in and carry-out window 75 is formed in the side wall of the casing of each of the wafer processing equipments 11 through 14 which wall is on the side Of the transferring passageway "Load" of the AGV 60. The window 75 is provided with an automatic door 76 for opening and closing it. Further in FIG. 4, reference numeral 77 designates a stand provided for cassettes (hereinafter referred to as "a cassette stand 77", when applicable).

In FIG. 1, the stocker 20 has container carry-out openings 21, behind which there are container handling equipments 22 respectively.

Further in FIG. 4, reference numerals 91 and 92 designate optical communications equipments. The wafer processing equipments 11 through 14 carry out sequential operations (described later) while communicating with the AGV 60 through the optical communications equipments 91 and 92.

In the system of the invention, the container handling equipment 22 takes the closed container 40, in which a cassette 52 to be processed has been stored, out of the stocker 20 and places it on the container placing section 66 of the AGV 60. Under this condition, the cam shaft 49 extended from the lifting stand 67 is engaged with the cam 45 in the bottom lid 44 of the closed container 40, and a container retainer (not shown) engages the flange 42A of the closed container 40 from above, thus fixedly holding the latter 40. The AGV 60, on which the closed container 40 has been set in the above-described manner, is moved to the wafer processing equipment (11 for instance) which has been specified by an instruction from a central control room, and stopped at a predetermined position where the cassette carry-in and carry-out window 62 confronts with the cassette carry-in and carry-out window 75 of the wafer processing equipment 11.

(1) After the AGV 60 stops at the predetermined position, the cam shaft 49 is turned to disengage the lock arm 46 from the recess 42B of the bottom lid 44; that is, an unlocking operation is carried out.

(2) Thereafter, the lifting stand 67 is lowered to the position indicated by the chain lines while supporting the cassette 52 and the bottom lid 44.

(3) Under this condition, the automatic doors 63 and 76 are opened while the cassette placing member 72 comes out of its retracting position to approach the cassette 52 from above. Thereafter, the cassette placing member 72 lifts the cassette 52 slightly and then moves it to the cassette carry-in and carry-out window 62, and transfers it through the window 62 and the cassette carry-in and carry-out window 75 of the wafer processing equipment into the latter, and then places it on the cassette stand 77.

(4) Thereafter, the cassette placing member 72 is returned to its original position, and the doors 63 and 76 are closed. After the cassette placing member 72 is returned to its original position in this way, the lifting stand 67 is moved upwardly, to close the opening 65.

(5) In the wafer processing equipment 11, a transferring mechanism (not shown) is operated to move the cassette 52 from the cassette stand 77, for instance, to a CVD furnace.

The wafers processed are taken out of the wafer processing equipment as follows:

(6) The cassette accommodating the wafers processed is placed on the cassette stand 77 with the aforementioned transferring mechanism (not shown).

(7) After the cassette with the wafers has been placed on the cassette stand 77, the above-described operating steps (1) through (5) are carried out in the reverse order, so that the cassette is set in the closed container 40.

Figure 2:
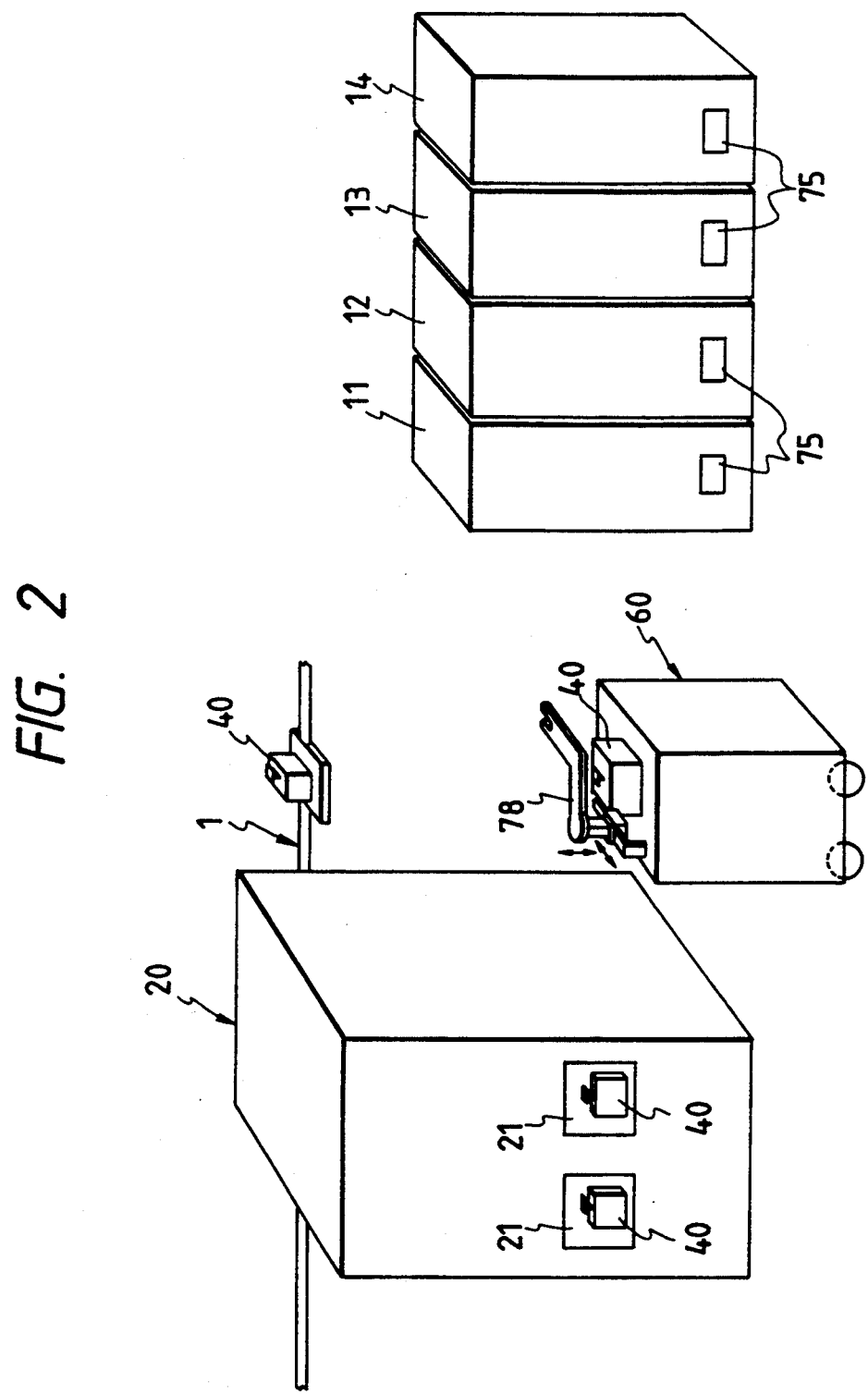
FIG. 2 is a perspective view showing the arrangement of another example of the automatic transferring system, which constitutes a second embodiment of the invention.

FIG. 2 shows a second embodiment of the invention. The second embodiment is different from the above-described first embodiment in that the stocker 20 has no container handling equipment, and instead the automated guided vehicle 60 has a container handling equipment 78.

Figure 3:
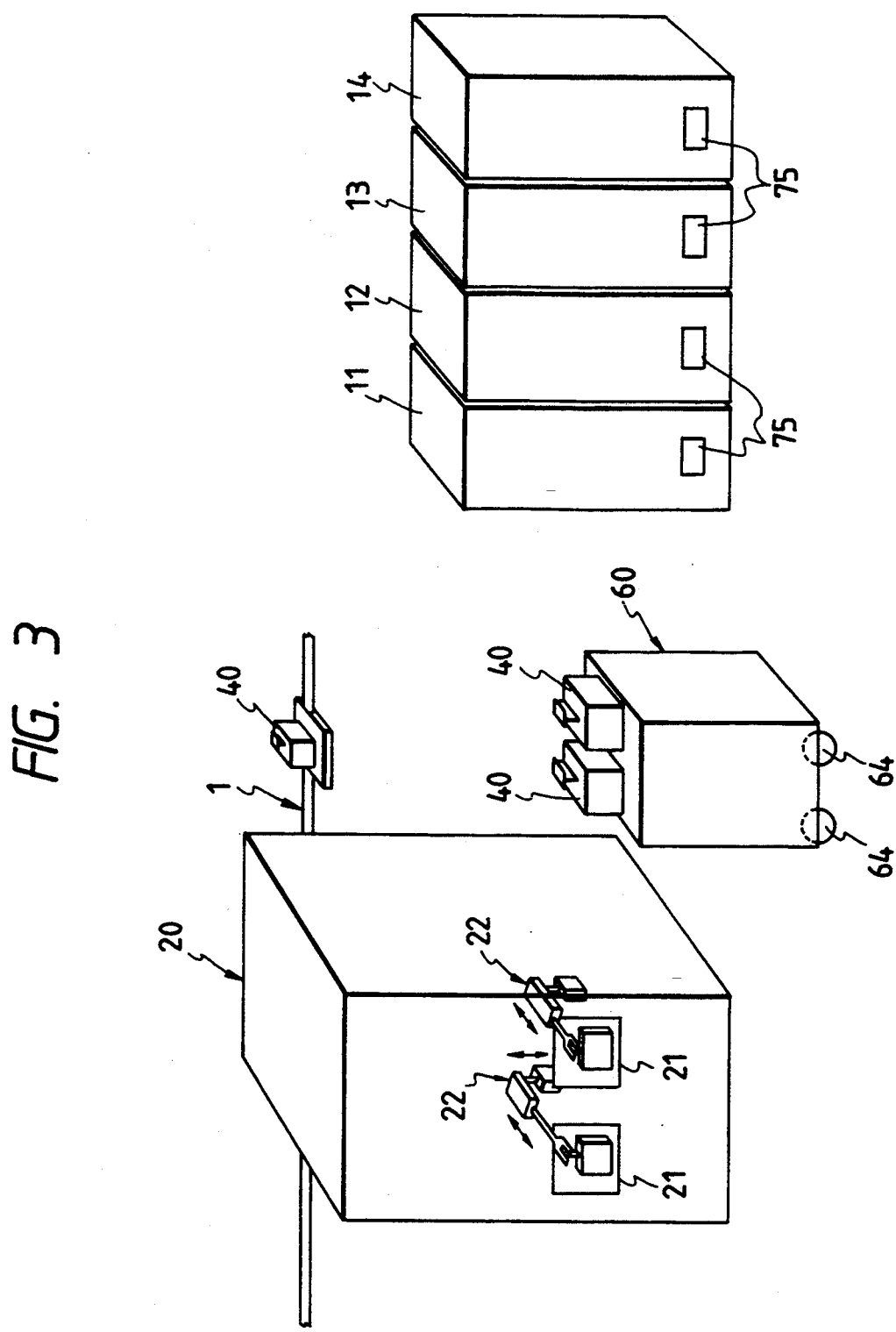
FIG. 3 is a perspective view showing the arrangement of another example of the automatic transferring system, which constitutes a third embodiment of the invention.

FIG. 3 shows a third embodiment of the invention. In the third embodiment, the AGV 60 is so designed that it is able to transfer a plurality of closed containers 40, and has container interfaces respectively for the closed containers.

Figure 5:
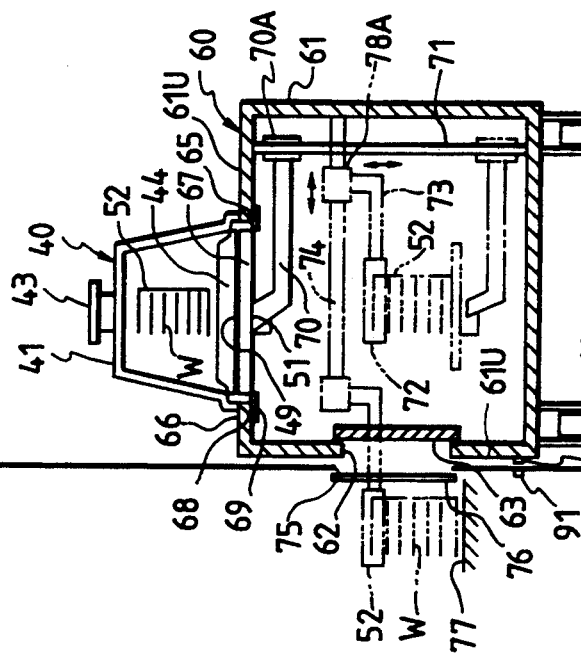
FIG. 5 is a sectional view of another example of the automated guided vehicle.

FIG. 5 shows one modification of the AGV 60. The AGV shown in FIG. 5 is different from the one shown in FIG. 4 in that it has no cassette placing member 72 and accordingly no mechanism for driving the latter 72. In this connection, it should be noted that each of the wafer processing equipments 11 through 14 has a cassette placing member 72 and a mechanism 79 for driving it.

Figure 6:
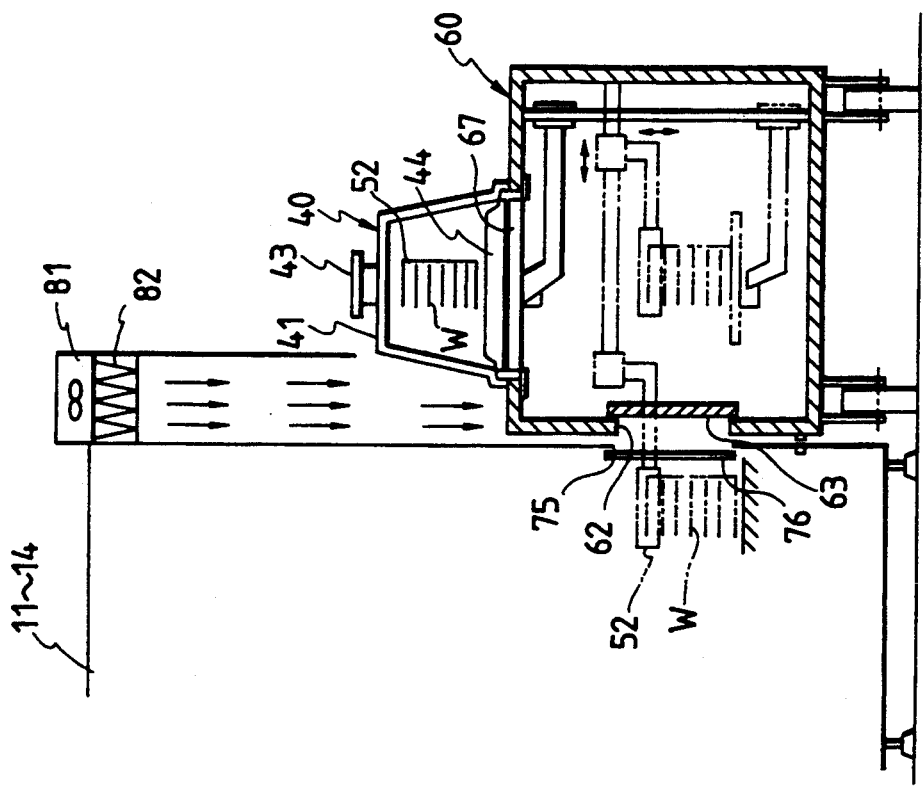
FIG. 6 is an explanatory diagram showing dust proofing means provided for a cassette transferring space between the automated guided vehicle and a wafer processing equipment.

In FIG. 6, reference numeral 81 designates a blower; and 82, a high power filter (such as HEPA (high efficiency particulate air-filter) and ULPA (ultra low penetration air-filter)) which forms means for providing a clean environment. The blower and the filter are mounted on the upper portion of the side wall of each of the wafer processing equipments 11 through 14 which wall is on the side of the transferring passageway "Load" of the AGV 60. The blower 81 and the filter 82 operate to blow clean air towards the windows 62 and 75 from above while the cassette is being moved from the AGV 60 to the wafer processing equipment or vice versa.

That is, the blower 81 and the filter 82 provide a clean environment between the cassette carry-in and carry-out window 62 of the AGV 60 and the cassette carry-in and carry-out window 75 of the wafer processing equipment 11, so that the cassette 52 is moved from the AGV 60 to the wafer processing equipment or vice versa while being kept in the clean environment. This prevents dust from sticking to the wafers during the movement.

Figure 7:
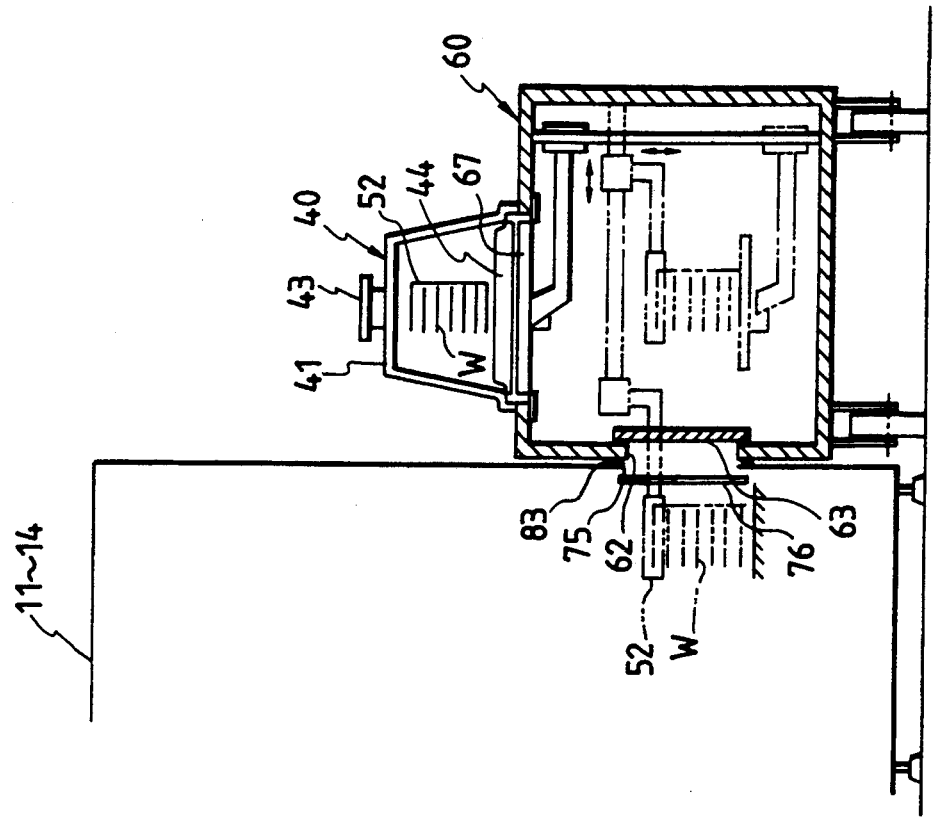
FIG. 7 is an explanatory diagram showing another example of the dust proofing means.

FIG. 7 shows another example of the means for providing a clean environment. One end of a bellows (or hood) 83 is fixedly set around one of the windows 62 and 75, and the other end is pushed against the wall defining the other window in such as manner as to surround the latter. In this case, the windows 62 and 75 are communicated with each other through the bellows 83. The bellows (or hood) 83 is stretched or compressed by an actuator (not shown).

Figure 8:
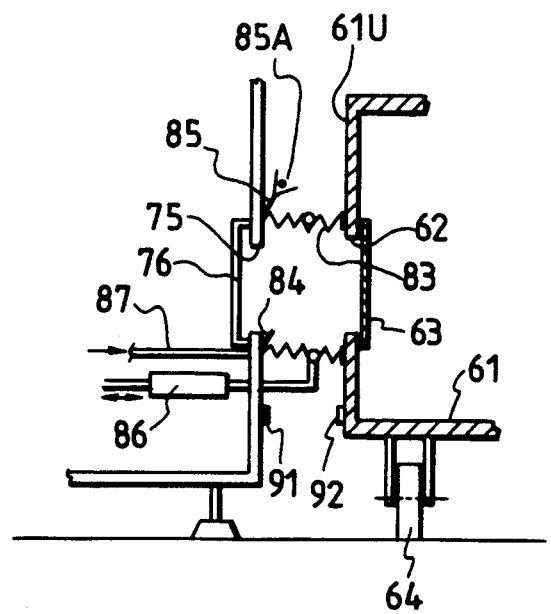
FIG. 8 is an explanatory diagram showing another example of the dust proofing means.
Figure 9:
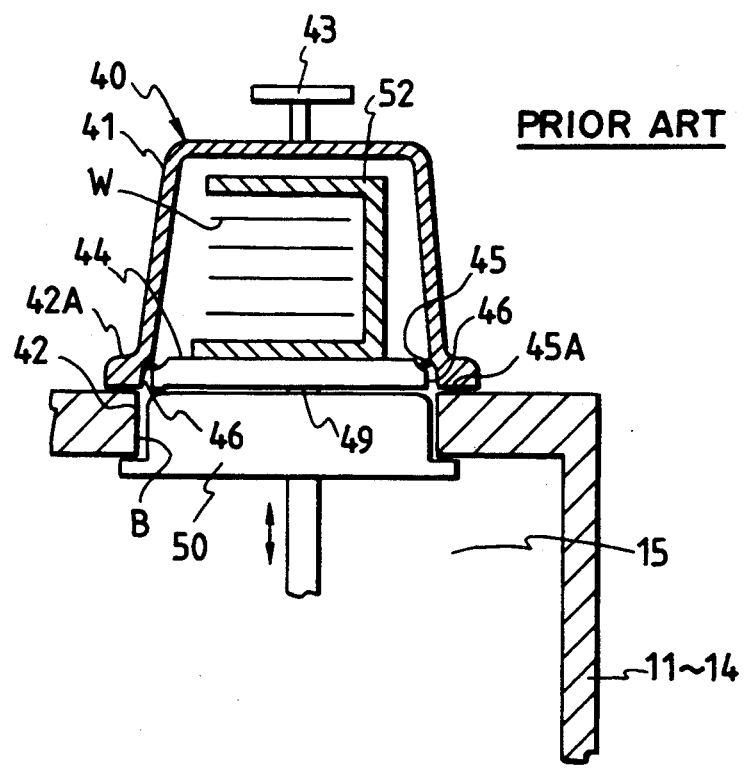
FIG. 9 is a sectional view showing one example of a known portable closed container.
Figure 10:
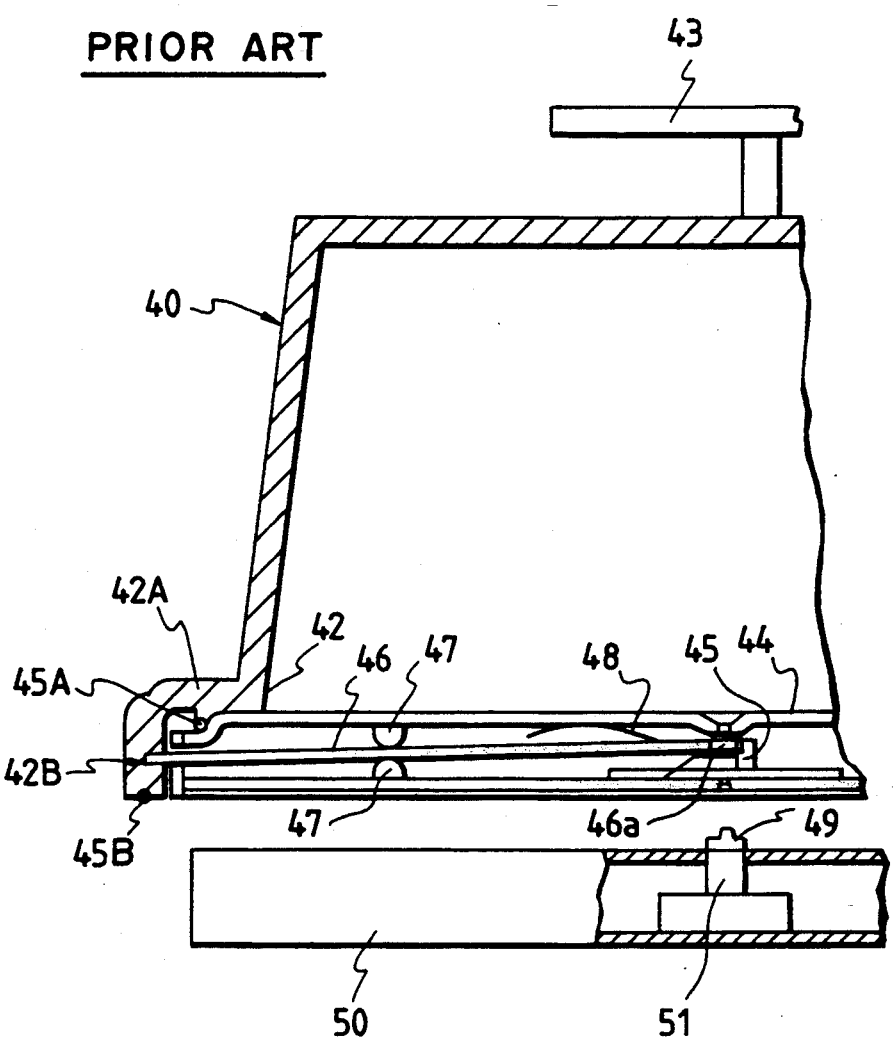
FIG. 10 is a diagram showing one example of a known portable closed container locking/unlocking mechanism.
Figure 11:
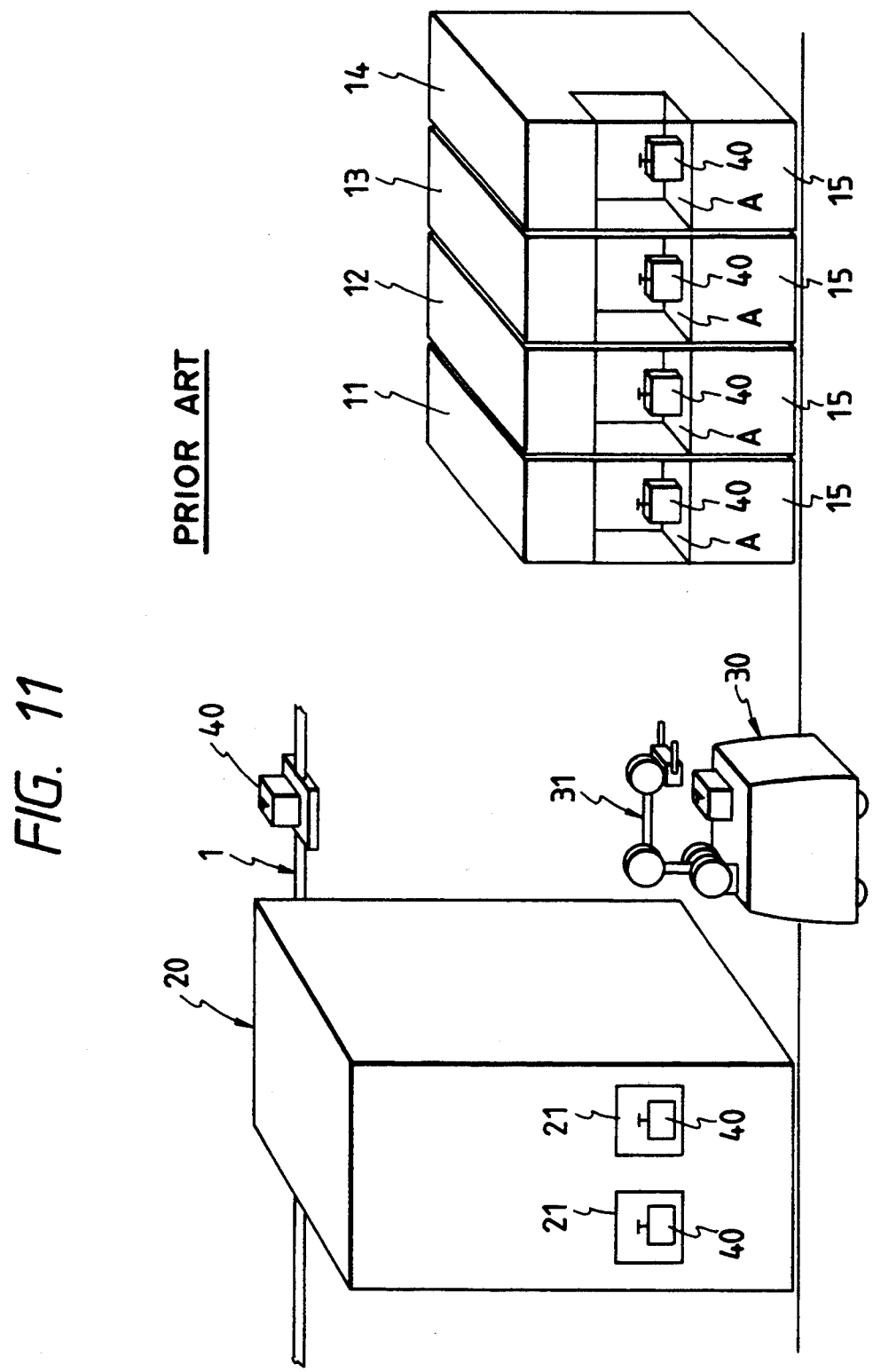
FIG. 11 is a perspective view showing the arrangement of a conventional automatic transferring system.

FIG. 8 shows another example of the means for providing a clean environment. In the case of FIG. 8, the bellows 83 has an air supplying inlet 84, and an air discharging outlet 85 with a valve 85A, and it is stretched or compressed by an actuator 86. In FIG. 8, reference numeral 87 designates a clean air supplying pipe.

Recently, native oxide films formed on the surfaces of wafers have been regarded as a problem to be solved. That is, in order to suppress the growth of the native oxide films, much has been said about the necessity of purging the insides of the wafer processing equipments 11 through 14 and the closed container 40 with a gas, such as nitrogen gas and dry air, which is inert with the wafers. In the system in which the wafer processing equipments 11 through 14 and the closed container 40 are filled with the inert gas, the clean environment providing means as shown in FIG. 8 may be utilized as follows: That is, in FIG. 8, the clean air supplying pipe 87 is employed as an inert gas supplying pipe, and the space defined by the doors 63 and 76 and the bellows 83 is purged with the inert gas, and then the doors 63 and 76 are opened. It goes without saying that the inside of the carriage may be gas-purged when necessary.

As was described above, the container interface is provided on the side of the transferring equipment, which makes it unnecessary for the processing equipments to have the container interfaces. Hence, the processing equipments can be miniaturized as much, and the space in the system can be utilized more effectively.

What is claimed is:

1. An automatic article transferring system comprising:
   a wafer cassette accommodating at least one article to be transferred;
   a portable closed container for housing said wafer cassette, said container including access means that is movable relative to the reminder of the container for providing access to within said container for inserting and removing said wafer cassette therefrom;
   an automated, guided vehicle having a body portion;
   means for transferring said container, with said wafer cassette located therein, from a first processing station unto said vehicle;
   means, carried by said vehicle, for shifting said wafer cassette from said container to within the body portion of said vehicle by manipulating said access means; and
   means for transferring said wafer cassette from within the body portion of said vehicle to a second processing station.

2. An automatic transferring system as claimed in claim 1, wherein said means for transferring said container from a first processing station unto said vehicle is carded by said vehicle.

3. An automatic transferring system as claimed in claim 1, wherein said means for transferring said container from a first processing station unto said vehicle is carded by the first processing station.

4. An automatic transferring system as claimed in claim 1, wherein said means for transferring said wafer cassette from within the body portion of said vehicle to a second processing station is entirely carried by said vehicle.

5. An automatic transferring system as claimed in claim 1, wherein said means for transferring said wafer cassette from within the body portion of said vehicle to a second processing station is at least partially carried by said the second processing station.

6. An automatic transferring system as claimed in claim 1, wherein said means for transferring said wafer cassette from within the body portion of said vehicle to a second processing station includes a window that can be selectively opened to provide access to within the body portion of said vehicle.

7. An automatic transferring system as claimed in claim 6, further comprising dust proofing means for preventing debris from engaging the article as the wafer cassette is transferred from the body portion of the vehicle.

8. An automatic transferring system as claimed in claim 7, wherein said dust proofing means includes means for developing a stream of clean fluid flowing across said window.

9. An automatic transferring system as claimed in claim 7, wherein said dust proofing means includes a bellows that extends about said window and between the vehicle and the second processing station.

10. An automatic transferring system as claimed in claim 9, further comprising means for purging an inside of said bellows with an inert gas.

11. A method of transferring a wafer cassette accommodating at least one article from a first processing station, to an automated guided vehicle and then to a second processing station comprising:

transferring the wafer cassette within a container from the first processing station unto the automated guided vehicle;

shifting the wafer cassette from within the container to within an internal body portion of said vehicle; and transferring the wafer cassette from the vehicle through a window that opens into the internal body portion of the vehicle to the second processing station through a door opening into the second processing station.

12. A method of transferring a wafer cassette as claimed in claim 11, further comprising preventing debris from engaging the article as the wafer cassette is transferred from the vehicle to the second processing station.

* * * * *